United States Patent
Hironaka et al.

(10) Patent No.: US 10,120,011 B2
(45) Date of Patent: Nov. 6, 2018

(54) TEST UNIT

(71) Applicant: NHK Spring Co., Ltd., Yokohama-shi (JP)

(72) Inventors: Kohei Hironaka, Nagano (JP); Takashi Nidaira, Nagano (JP); Tomohiro Yoneda, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 66 days.

(21) Appl. No.: 15/117,884

(22) PCT Filed: Feb. 12, 2015

(86) PCT No.: PCT/JP2015/053866
§ 371 (c)(1),
(2) Date: Aug. 10, 2016

(87) PCT Pub. No.: WO2015/122471
PCT Pub. Date: Aug. 20, 2015

(65) Prior Publication Data
US 2017/0010315 A1    Jan. 12, 2017

(30) Foreign Application Priority Data
Feb. 13, 2014 (JP) ................. 2014-025958

(51) Int. Cl.
G01R 31/02    (2006.01)
G01R 1/073    (2006.01)
(Continued)

(52) U.S. Cl.
CPC ........... *G01R 31/026* (2013.01); *G01R 1/073* (2013.01); *G01R 31/26* (2013.01);
(Continued)

(58) Field of Classification Search
CPC ...... G01R 31/26; G01R 1/073; G01R 31/026; G01R 31/2886; G01R 31/2896; H01R 13/2435
See application file for complete search history.

(56) References Cited

U.S. PATENT DOCUMENTS

2007/0109000 A1    5/2007    Inoue et al.
2009/0278559 A1    11/2009    Inoue et al.
(Continued)

FOREIGN PATENT DOCUMENTS

JP    2001-281300 A    10/2001
JP    2007-163463 A    6/2007
(Continued)

OTHER PUBLICATIONS

Office Action dated Feb. 17, 2016, issued for the Taiwanese application No. 104104993 and English translation thereof.
(Continued)

*Primary Examiner* — Jermele M Hollington
*Assistant Examiner* — Suresh K Rajaputra
(74) *Attorney, Agent, or Firm* — Locke Lord LLP

(57) ABSTRACT

A test unit according to the present invention includes: a first contact probe contacting with an electrode provided on a front surface of one of contact targets, and contacting with an electrode of the other contact target; a second contact probe contacting with an electrode provided on a back surface of the one of contact targets and contacting with an electrode of a substrate; a first probe holder including a suction holder that sucks and holds the one of contact targets, and accommodating and holding therein the first contact probes; a second probe holder accommodating and holding therein the second contact probes; and a base portion, which is layered over the first probe holder and holds the other contact target at a side thereof layered over the first probe holder; and a gap is formed between the other contact target and the first probe holder.

4 Claims, 8 Drawing Sheets

(51) Int. Cl.
   *H01R 13/24*   (2006.01)
   *G01R 31/28*   (2006.01)
   *G01R 31/26*   (2014.01)
(52) U.S. Cl.
   CPC ..... *G01R 31/2886* (2013.01); *G01R 31/2896* (2013.01); *H01R 13/2435* (2013.01)

(56) References Cited

U.S. PATENT DOCUMENTS

| | | | |
|---|---|---|---|
| 2011/0095779 A1* | 4/2011 | Washio | G01R 31/2887 324/756.05 |
| 2011/0279136 A1 | 11/2011 | Shiozawa | |
| 2015/0285840 A1* | 10/2015 | Matsui | G01R 1/06722 324/754.14 |

FOREIGN PATENT DOCUMENTS

| | | |
|---|---|---|
| JP | 2011-242149 A | 12/2011 |
| TW | M361020 U | 7/2009 |
| TW | 201350882 A | 12/2013 |
| WO | 2005/036188 A1 | 4/2005 |

OTHER PUBLICATIONS

International Search Report dated Apr. 21, 2015, issued for PCT/JP2015/053866.

* cited by examiner

TEST UNIT

FIELD

The present invention relates to a test unit, which is used in a continuity test or an operation characteristic test on a test target, such as a semiconductor integrated circuit.

BACKGROUND

Conventionally, when a continuity test or an operation characteristic test on a test target, such as a semiconductor integrated circuit (package) or a liquid crystal panel, is performed, a probe unit, which accommodates therein a plurality of contact probes, is used, in order to electrically connect between the test target and a signal processing device that outputs a test signal. Along with recent development of high integration and refinement of semiconductor integrated circuits and liquid crystal panels, techniques for probe units have developed, which are applicable to test targets that are more highly integrated and more refined, by narrowing of the pitch among the contact probes. Further, packages having electrodes provided on both sides thereof have started to be used.

As a technique for performing testing by contact with respective electrodes provided on both sides of a package, a test device has been disclosed, which performs testing (measurement) by use of a contact probe and a wiring to thereby contact the electrodes provided on both sides with electrodes on a circuit board for testing and ensure electric conduction (for example, see Patent Literature 1).

Further, in Patent Literature 1, a structure provided with a suction block that holds a package by suction is also disclosed. By sucking and conveying the packages with the suction block, when testing is performed while the packages are changed, testing of plural packages is abled to be performed efficiently.

For semiconductor integrated circuits to be tested, in order to reduce their mounting areas and shorten their wirings, a package mode with different semiconductor packages layered over each other has been put into use, recently. Package on Package (PoP) is an example of multi-layering of semiconductor packages. In PoP, at least one semiconductor package of two semiconductor packages has electrodes on both sides thereof.

CITATION LIST

Patent Literature

Patent Literature 1: Japanese Patent Application Laid-open No. 2007-163463

SUMMARY

Technical Problem

However, when a continuity test between two semiconductor packages layered over each other is performed by application of the technique in Patent Literature 1 to PoP, a suction block is required to be provided between the two semiconductor packages and suction holes are required to be secured in this suction block, and thus testing is unable to be performed in a state where the two semiconductor packages have been arranged in their layering direction. Therefore, testing needs to be performed in a state where the two semiconductor packages have been arranged to be shifted from the layering direction, and thus there has been problems that the tact time of the test is increased due to extension of the conduction path of a signal between the respective electrodes, and the test accuracy is reduced due to variation in the signal path length.

The present invention has been made in view of the above, and an object thereof is to provide a test unit that is able to perform a continuity test while preventing reduction in test accuracy and increase in tact time when two semiconductor packages are tested.

Solution to Problem

To solve the above-described problem and achieve the object, a test unit according to the present invention performs testing of two contact targets, at least of one of which includes electrodes on both sides thereof, the two contact targets being substantially plate shaped and arranged in a layering direction thereof. The test unit includes: a first contact probe that comes into contact, at one longitudinal direction end portion side thereof, with an electrode provided on a front surface of one of the contact targets, and comes into contact, at the other end portion side thereof, with an electrode of the other contact target; a second contact probe that comes into contact, at one longitudinal direction end portion side thereof, with an electrode provided on a back surface of the one of the contact targets, and comes into contact, at the other end portion side thereof, with an electrode of a substrate that outputs a signal for the testing; a first probe holder including a suction holder that sucks and holds the one of the contact targets and accommodating and holding therein a plurality of the first contact probes according to a predetermined pattern; a second probe holder accommodating and holding therein a plurality of the second contact probes according to a predetermined pattern; and a base portion that is layered over the first probe holder and holds, at a side thereof layered over the first probe holder, the other contact target, and a gap is formed between the other contact target and the first probe holder.

Moreover, in the above-described test unit according to the present invention, the base portion includes a flow channel formed therein, through which the gap communicates with outside.

Moreover, in the above-described test unit according to the present invention, the suction holder includes: a suction pad that is formed by use of an elastic material, sucks and holds the one of the contact targets, has a substantially tube shape, and includes a through hole formed therein, the through hole communicating with the gap; a holding portion that holds an outer periphery of the suction pad and is approachably and separably attached to the first probe holder; and a coil spring that biases the holding portion in a direction in which the holding portion separates from the first probe holder.

Moreover, in the above-described test unit according to the present invention, the first contact probe includes: a first contact member that is provided at the one longitudinal direction end portion side, has a plurality of claw portions having tapered distal end shapes, and comes into contact with the electrode of the contact target; a second contact member that is provided at the other longitudinal direction end portion side, has a plurality of claw portions having tapered distal end shapes, and comes into contact with the electrode of the substrate; and a coil spring that is provided between the first contact member and the second contact member, and expandably and contractably joins the first and second contact members together.

Advantageous Effects of Invention

According to the present invention: since a first contact probe, which comes into contact with an electrode provided on a front surface of one of contact targets and, comes into contact with an electrode of the other contact target; a second contact probe, which comes into contact with an electrode provided on a back side of the one of contact targets and comes into contact with an electrode of a substrate; a first probe holder, which has a suction holder that sucks and holds the one of contact targets, and accommodates and holds therein a plurality of the first contact probes; a second probe holder, which accommodates and holds therein a plurality of the second contact probes; and a base portion, which is layered over the first probe holder and holds the other contact target, at a side where the base portion is layered over the first probe holder, are included; and a gap is formed between the other contact target and the first probe holder; an effect of being able to perform a continuity test while preventing reduction in test accuracy and increase in tact time when two semiconductor packages are tested is achieved.

DESCRIPTION OF EMBODIMENTS

Hereinafter, modes for carrying out the present invention will be described in detail with the drawings. The present invention is not limited by the following embodiment. Further, each drawing referred to in the following description schematically illustrates shapes, sizes, and positional relations merely to an extent that allows contents of the present invention to be understood. That is, the present invention is not limited only to the shapes, sizes, and positional relations exemplified by each drawing.

Figure 1:
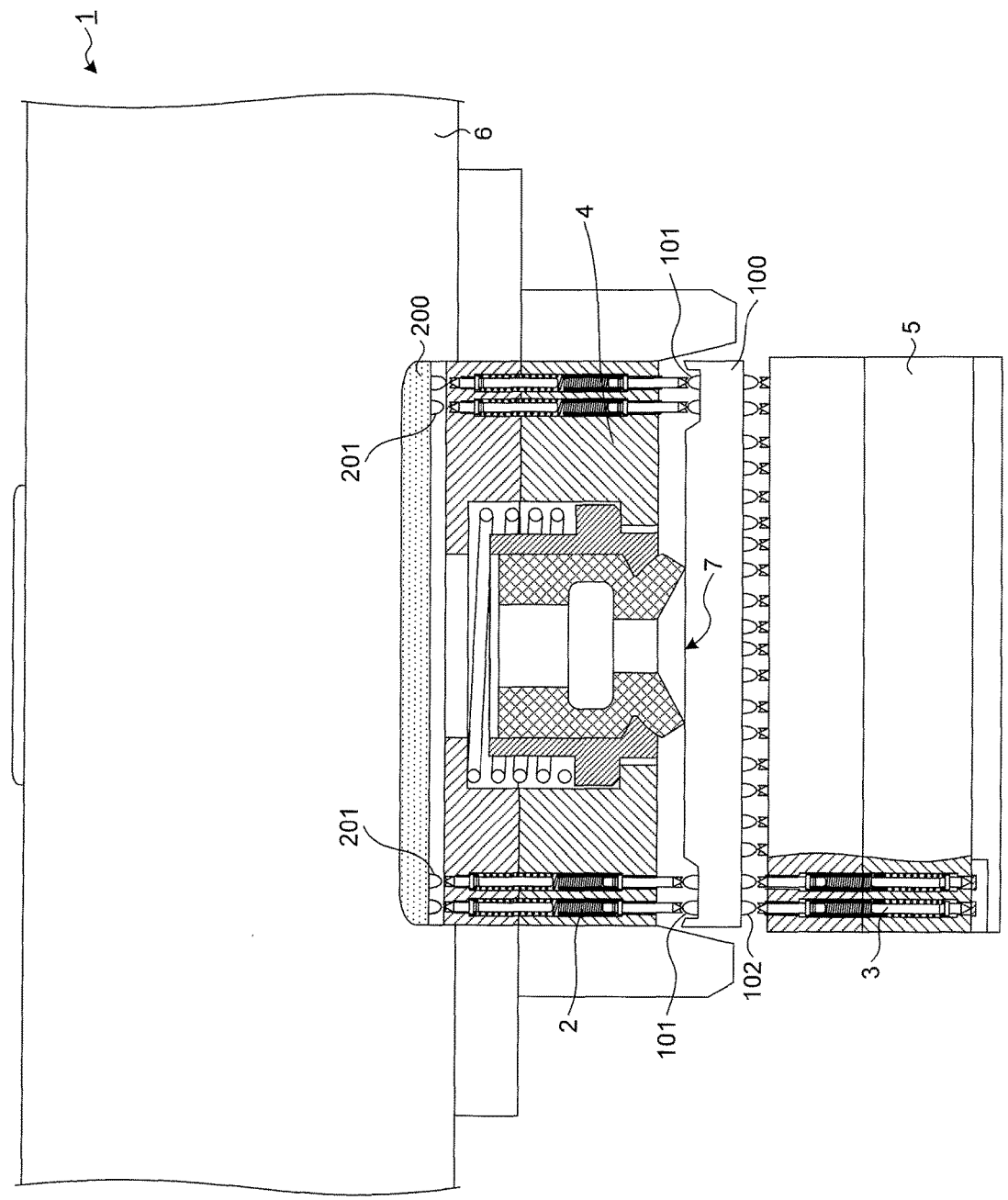
FIG. 1 is a partial cross sectional diagram illustrating a schematic configuration of a test unit according to an embodiment of the present invention.

FIG. 1 is a partial cross sectional diagram illustrating a schematic configuration of a test unit 1 according to an embodiment of the present invention. The test unit 1 illustrated in FIG. 1 is a device used in performing an electric property test of semiconductor packages 100 and 200 to be tested, and is a device that electrically connects the semiconductor package 100 to a circuit board 300 (see FIG. 4) that outputs a test signal to the semiconductor package 100. The semiconductor packages 100 and 200 are used in a device or the like as a PoP formed by being layered over each other. In this embodiment, the semiconductor package 100 has electrodes provided on both sides thereof. Further, the semiconductor package 200 is realized by, for example, Double Data Rate (DDR), and is mounted on the semiconductor package 100 as the PoP.

The test unit 1 includes: a plurality of contact probes 2 (hereinafter, simply referred to as "probes 2"), which are formed by use of an electrically conducting material, such as metal or alloy, come into contact with one electrode of the semiconductor package 100 that is a body to be contacted, at one longitudinal direction end portion side thereof, and respectively come into contact with different electrodes of the semiconductor package 200, at the other end portion side thereof; a plurality of contact probes 3 (hereinafter, simply referred to as "probes 3"), which are formed by use of an electrically conducting material, such as metal or alloy, come into contact with one electrode of the semiconductor package 100 that is the body to be contacted, at one longitudinal direction end portion side thereof, and respectively come into contact with different electrodes of the circuit board 300 at the other end portion side thereof; a first probe holder 4 (hereinafter, simply referred to as "probe holder 4") that accommodates and holds therein the plurality of probes 2, according to a predetermined pattern; a second probe holder 5 (hereinafter, simply referred to as "probe holder 5") that accommodates and holds therein the plurality of probes 3, according to a predetermined pattern; and a base portion 6, which is joined to the probe holder 4 and is connected to a suction pump not illustrated. A holder member may be included, which is provided around the probe holder 5 and prevents positional displacement of the semiconductor package 100 that comes into contact with the plurality of probes 2 upon testing.

Figure 2:
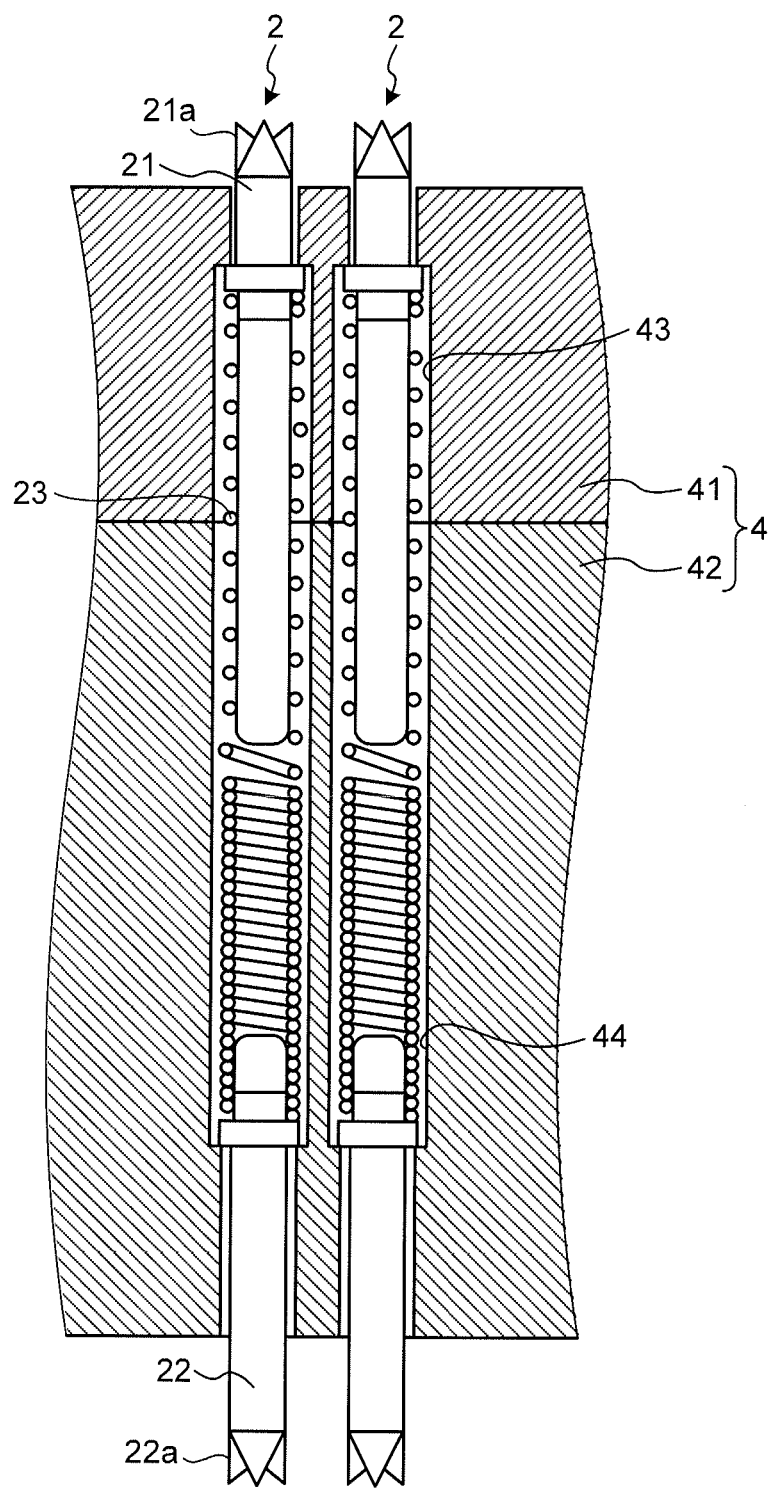
FIG. 2 is a partial cross sectional diagram illustrating a configuration of main parts of the test unit according to the embodiment of the present invention.

FIG. 2 is a partial cross sectional diagram illustrating a configuration of main parts of the test unit 1 according to this embodiment, and is a diagram illustrating a detailed configuration of the probes 2 accommodated in the probe holder 4. The probe 2 (first contact probe) illustrated in FIG. 2 includes: a first plunger 21 that comes into contact with a connection electrode 201 of the semiconductor package 200 when the semiconductor packages 100 and 200 are tested; a second plunger 22 that comes into contact with a connection electrode 101 of the semiconductor package 100; and a coil spring 23 that is provided between the first plunger 21 and second plunger 22 and expandably and contractably joins the two first plunger 21 and second plunger 22 together. The first plunger 21 and second plunger 22, and the coil spring 23, which form the probe 2, have the same axis line. The probes 2 lessen shock to the connection electrodes of the semiconductor packages 100 and 200 and apply load to the semiconductor packages 100 and 200, by the coil spring 23 expanding and contracting in an axis line direction when the semiconductor packages 100 and 200 are brought into contact therewith.

The probe holder 4 is formed by use of an insulating material, such as resin, machinable ceramic, or silicone, and is formed of a first member 41 positioned at an upper surface side in FIG. 2 and a second member 42 positioned at a lower surface side in FIG. 2, which are layered over each other. The first member 41 and second member 42 respectively have the same numbers of holder holes 43 and 44 formed therein for accommodating the plurality of probes 2, and the holder holes 43 and 44 that accommodate therein the probe 2 are formed such that their axis lines are aligned with each other. Positions at which the holder holes 43 and 44 are formed are determined according to a wiring pattern of the semiconductor package 100.

Figure 3:
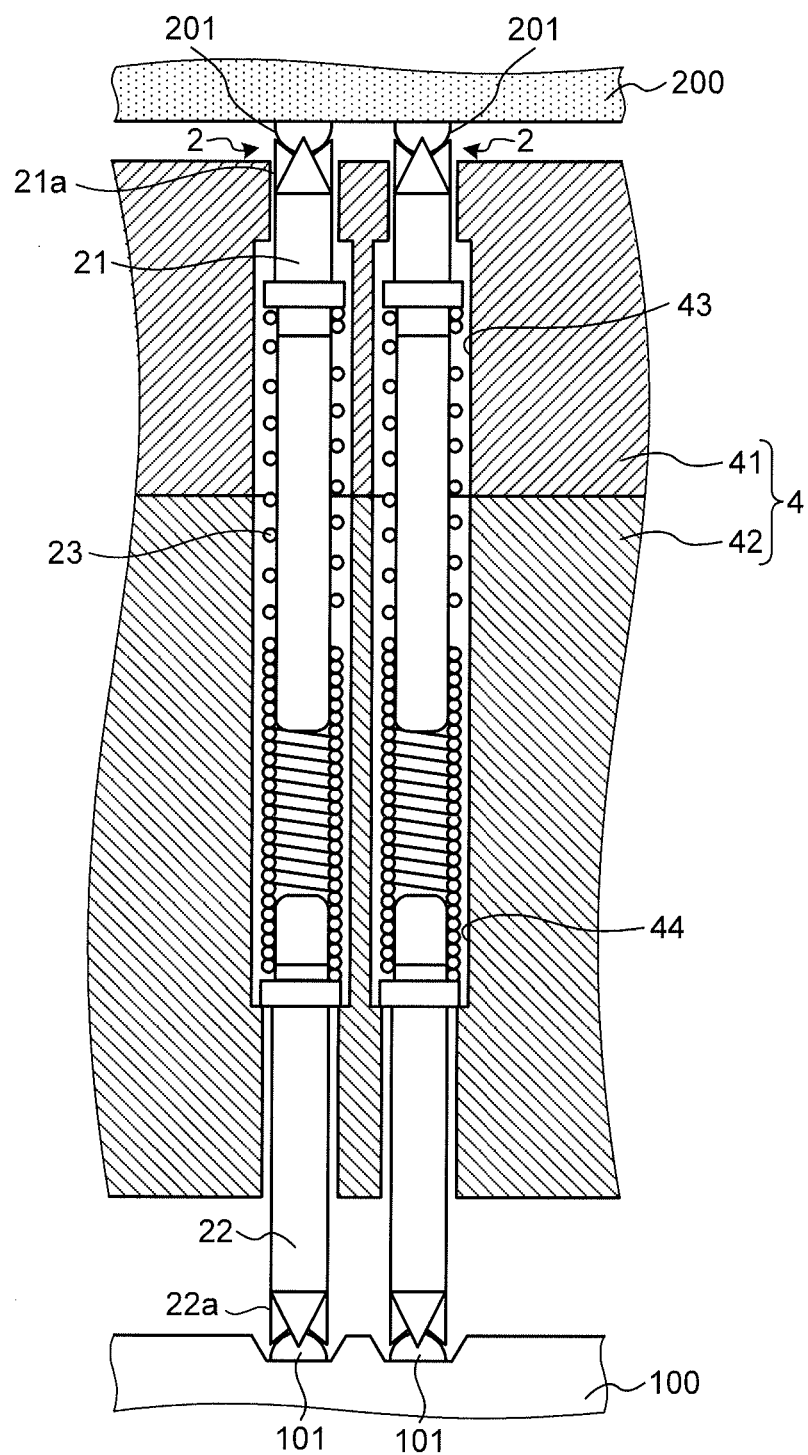
FIG. 3 is a partial cross sectional diagram illustrating a configuration of main parts of the test unit in testing of a semiconductor package, according to the embodiment of the present invention.

FIG. 3 is a partial cross sectional diagram illustrating a configuration of main parts of the test unit upon testing of the semiconductor packages according to this embodiment, and is a diagram illustrating a state upon testing of the semiconductor packages 100 and 200 by use of the probe holder 4. When the semiconductor packages 100 and 200 are tested, by contact load from the semiconductor packages 100 and 200, the coil spring 23 is in a state of being compressed along a longitudinal direction thereof. When the coil spring 23 is compressed, as illustrated in FIG. 3, a proximal end portion of the first plunger 21 goes into the coil spring 23 and slidingly contacts an inner peripheral side of the coil spring 23.

Figure 4:
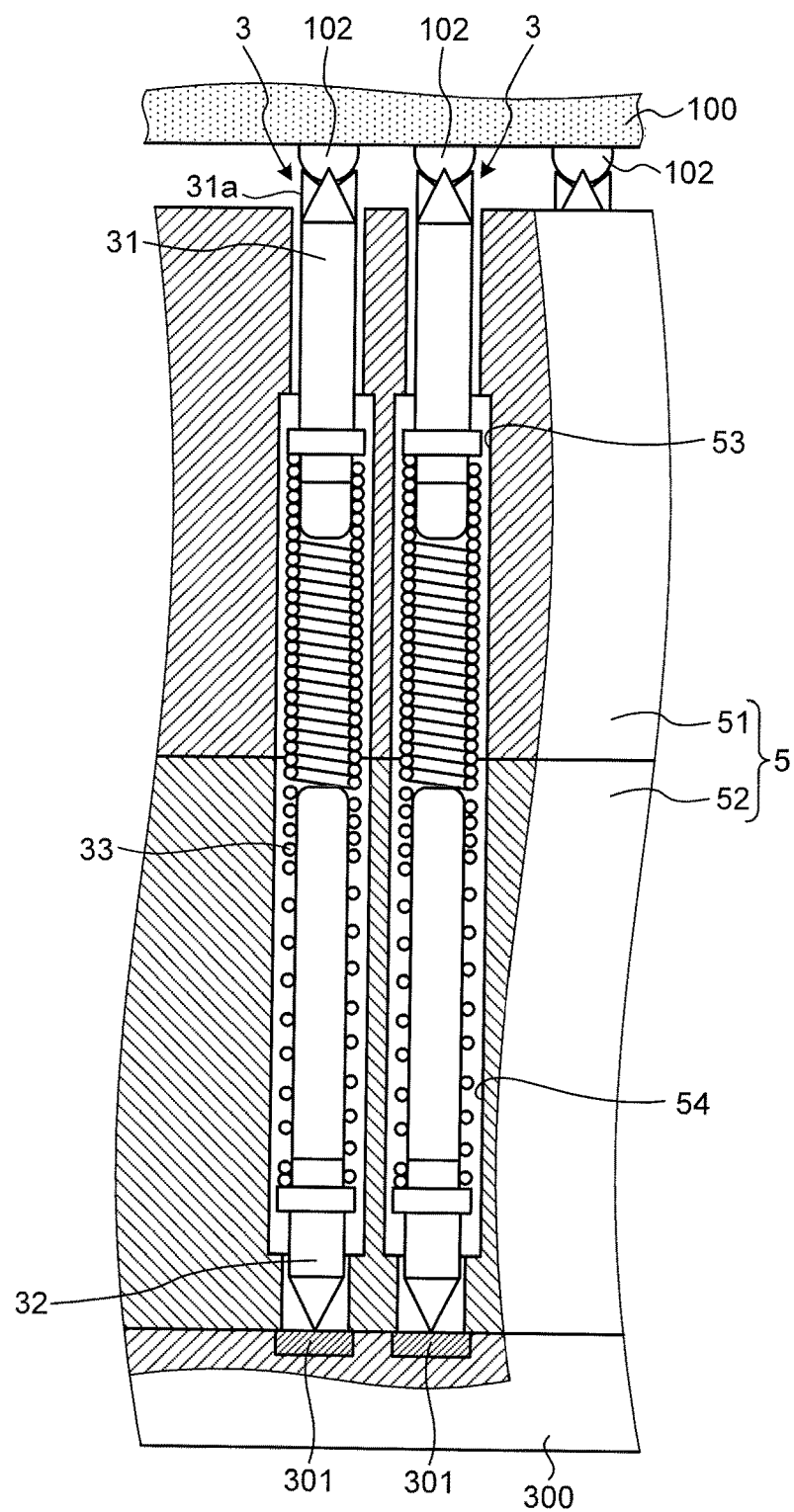
FIG. 4 is a partial cross sectional diagram illustrating a configuration of main parts of the test unit according to the embodiment of the present invention.

FIG. 4 is a partial cross sectional diagram illustrating a configuration of main parts of the test unit 1 according to this embodiment, and is a diagram illustrating a detailed configuration of the probes 3 accommodated in the probe holder 5. The probe 3 (second contact probe) illustrated in FIG. 4 includes: a first plunger 31 that comes into contact with a connection electrode 102 of the semiconductor package 100 when the semiconductor packages 100 and 200 are tested; a second plunger 32 that comes into contact with an electrode 301 of the circuit board 300 including a test circuit; and a coil spring 33 that is provided between the first plunger 31 and second plunger 32 and expandably and contractably joins the two first plunger 31 and second plunger 32 together. The first plunger 31 and second plunger 32, and the coil spring 33, which form the probe 3, have the same axis line. The probes 3 lessen shock to the connection electrode of the semiconductor package 100 and apply load to the semiconductor package 100 and circuit board 300, by the coil spring 33 expanding and contracting in an axis line direction when the semiconductor package 100 is brought into contact therewith.

The probe holder 5 is formed by use of an insulating material, such as resin, machinable ceramic, or silicone, and is formed of a first member 51 positioned at an upper surface side in FIG. 4 and a second member 52 positioned at a lower surface side in FIG. 4, which are layered over each other. The first member 51 and second member 52 respectively have the same numbers of holder holes 53 and 54 formed therein for accommodating the plurality of probes 3, and the holder holes 53 and 54 that accommodate the probe 3 are formed such that their axis lines are aligned with each other. Positions at which the holder holes 53 and 54 are formed are determined according to the wiring pattern of the semiconductor package 100.

The test signal supplied to the semiconductor package 100 from the circuit board 300 upon the testing reaches the connection electrode 102 of the semiconductor package 100 via the probe 3 from each electrode 301 of the circuit board 300. Further, the test signal that has reached the semiconductor package 100 reaches the connection electrode 201 of the semiconductor package 200 via the probe 2 from each connection electrode 101 of the semiconductor package 100.

Specifically, in the probe 3, the test signal reaches the connection electrode 102 of the semiconductor package 100 via the second plunger 32, a closely fitted wound portion 33a, and the first plunger 31. As described above, in the probe 3, since electricity is conducted between the first plunger 31 and second plunger 32 via the closely fitted wound portion of the coil spring 33, the conduction path of the electric signal is able to be minimized. Therefore, the signal is able to be prevented from flowing to a roughly wound portion of the coil spring 33 upon the testing, and reduction and stabilization of inductance are able to be achieved. The probe 2 has a similar conduction path therein.

Further, since at distal ends of the first plungers 21 and 31 and second plunger 22, a plurality of claw portions 21a, 22a, and 31a having tapered distal end shapes are formed, even if oxide films are formed on surfaces of the connection electrodes 101, 102, and 201, by breaking through the oxide films, the respective distal ends of the first plungers 21 and 31 and second plunger 22 are able to directly contact the connection electrodes 101, 102, and 201.

The claw portions 21a, 22a, and 31a are plurally provided along outer edges of distal end portions of the first plungers 21 and 31 and second plunger 22, and any of vertices of the claw portions 21a, 22a, and 31a contact the surfaces of the connection electrodes 101, 102, and 201. For the claw portions 21a, 22a, and 31a, at end portions of the distal ends of the first plungers 21 and 31 and second plunger 22, regions to form the claw portions 21a, 22a, and 31a are preferably provided four or more each, by equally dividing end surfaces of the plungers, the end surfaces perpendicular to a longitudinal direction of the plungers.

Figure 5:
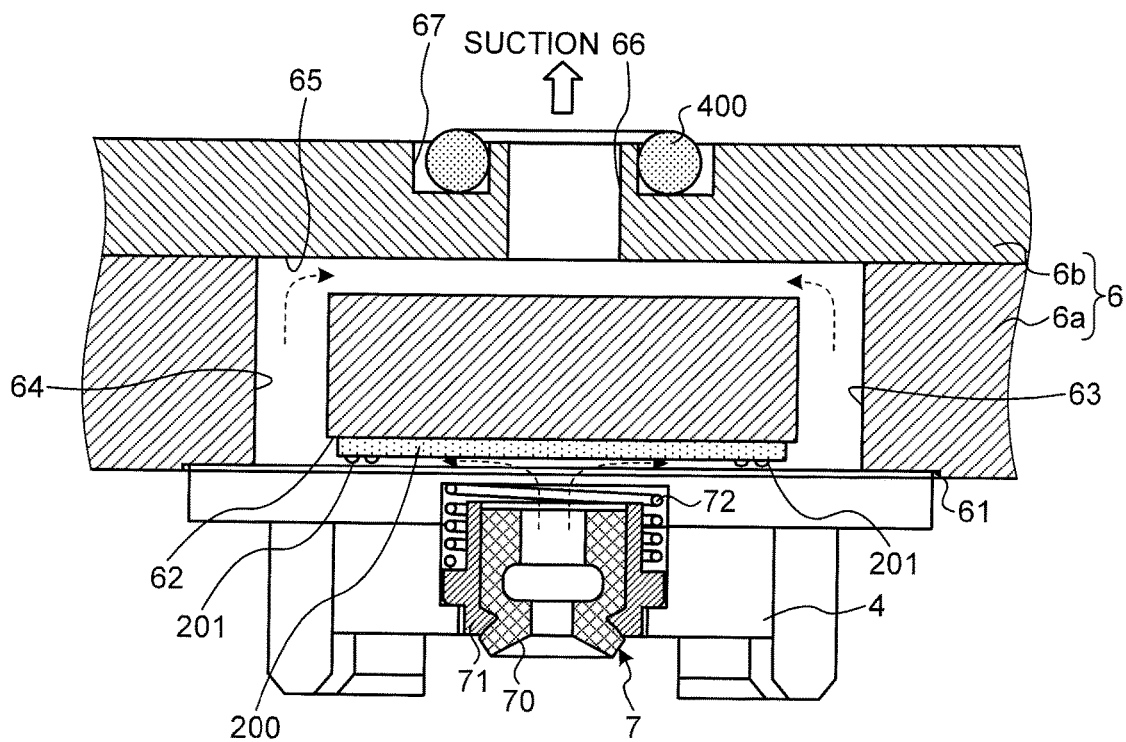
FIG. 5 is a partial cross sectional diagram illustrating a configuration of main parts of the test unit according to the embodiment of the present invention.
Figure 6:
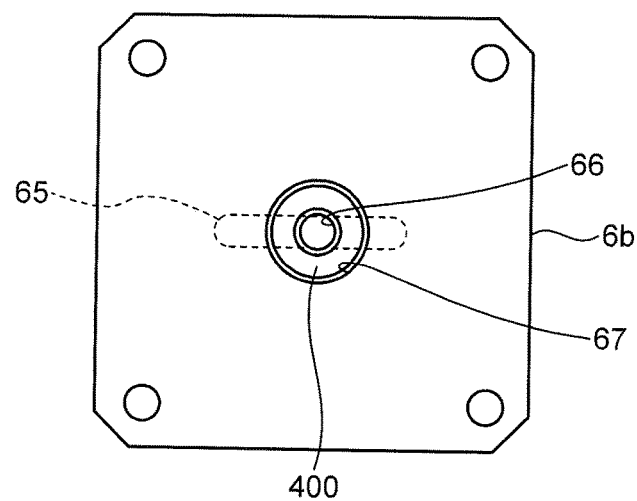
FIG. 6 is a diagram of the test unit illustrated in FIG. 1 as viewed from above.
Figure 7:
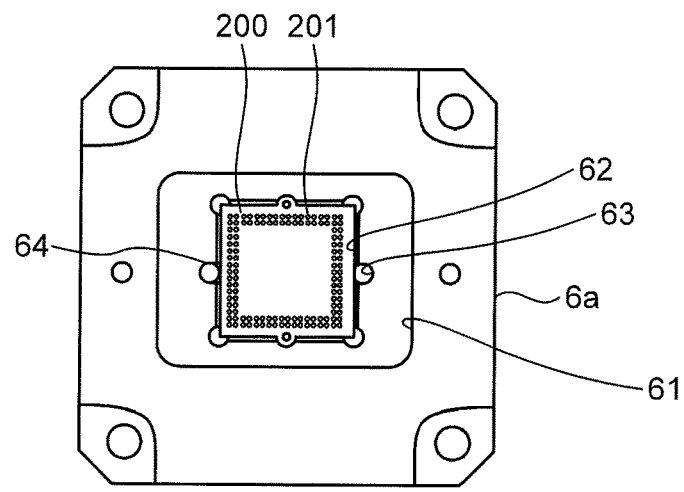
FIG. 7 is a diagram of a configuration of main parts of the test unit illustrated in FIG. 1 as viewed from below.
Figure 8:
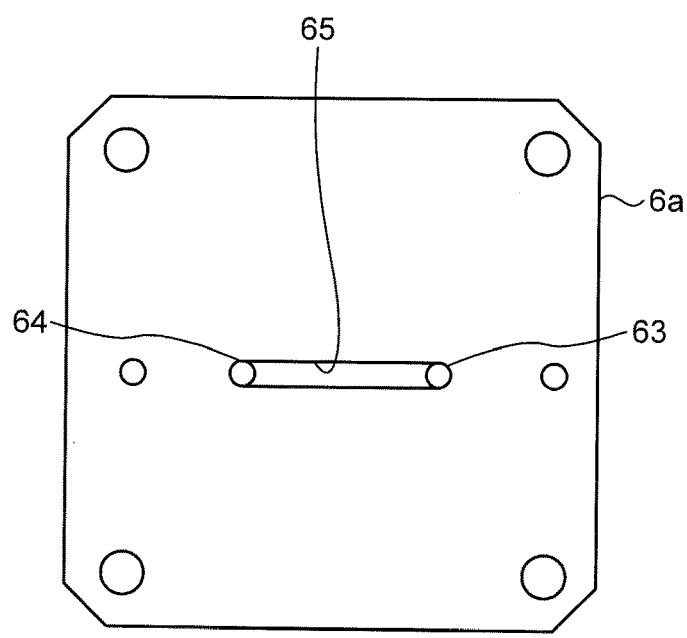
FIG. 8 is a diagram of a configuration of main parts of the test unit illustrated in FIG. 1 as viewed from above.

FIG. 5 is a partial cross sectional diagram illustrating a configuration of main parts of the test unit 1 according to this embodiment, and is a diagram illustrating a configuration of a part of the probe holder 4 and base portion 6. FIG. 6 is a diagram of the test unit 1 illustrated in FIG. 1 as viewed from above, and is a diagram illustrating a configuration of an upper surface of the base portion 6. FIG. 7 is a diagram of a configuration of main parts of the test unit 1 illustrated in FIG. 1 as viewed from below, and is a diagram of the base portion 6 as viewed from below in a state where the probe holder 4 has been removed therefrom. FIG. 8 is a diagram of a configuration of main parts of the test unit 1 illustrated in FIG. 1 as viewed from above, and is a diagram illustrating a configuration of an upper surface of a first member 6a of the base portion 6 in a state where a second member 6b has been removed therefrom.

The base portion 6 has the first member 6a and the second member 6b, as illustrated in FIG. 5, layered over each other. The first member 6a and second member 6b are substantially plate shaped, and are formed with their corner portions chamfered. The first member 6a and second member 6b may be formed by use of an insulating material, such as resin, machinable ceramic, or silicone, or may be formed by use of an electrically conducting material, such as metal or alloy.

In the first member 6a: a first accommodating portion 61, which is formed on a principal surface at a side different from a side thereof layered over the second member 6b, and has an opening that is able to accommodate therein a part of the first member 41; and a second accommodating portion 62, which is formed inside the first accommodating portion 61, and has an opening that is able to accommodate therein the semiconductor package 200, are provided. In the first member 6a, the first accommodating portion 61 and second accommodating portion 62 form a hollow space having a cross section with a stepped shape, the cross section cut along a plane parallel to a plate thickness direction thereof.

Further, in the first member 6a: a first hole 63, which is a bottom portion of the first accommodating portion 61, extends in the plate thickness direction from an outer edge of the second accommodating portion 62, and is a hole that is substantially column shaped; a second hole 64, which is provided at a position opposite to the first hole 63, is a bottom portion of the first accommodating portion 61, extends in the plate thickness direction from an outer edge of the second accommodating portion 62, and is a hole that is substantially column shaped; and a first groove portion 65, which is provided on a principal surface at a side thereof layered over the second member 6b, joins the first hole 63 and second hole 64 together, and hollows out the principal surface of the first member 6a, are formed.

In the second member 6b: a hole portion 66, which penetrates therethrough in the plate thickness direction, and is a substantially column shaped hole; and a second groove portion 67, which is provided on a principal surface thereof at a side different from a side layered over the first member 6a, is provided along an outer periphery of the hole portion 66, and is an annular shaped groove, are formed. Further, an O-ring 400, which ensures sealability upon connection with the suction pump not illustrated, is provided in the second groove portion 67.

In the base portion 6, by the first member 6a and second member 6b being layered over each other, the first groove portion 65 and the hole portion 66 communicate with each other and a flow channel, which is substantially Y-shaped, is formed. By this flow channel, gas is able to be circulated in the plate thickness direction of the first member 6a and second member 6b.

Figure 9:
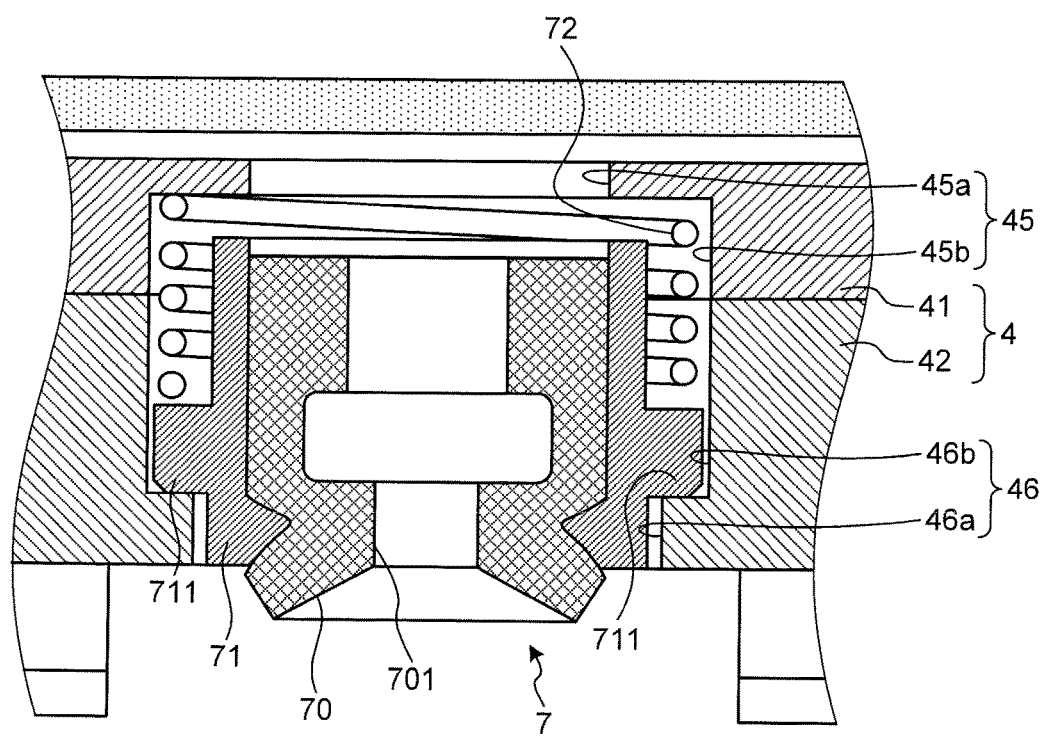
FIG. 9 is a cross sectional diagram illustrating a configuration of main parts of the test unit according to the embodiment of the present invention.

FIG. 9 is a cross sectional diagram illustrating a configuration of main parts of the test unit according to this embodiment, and is a diagram illustrating a configuration of a part of a suction holder 7 provided in the probe holder 4. As illustrated in FIG. 9, the suction holder 7 has: a suction pad 70, which is formed by use of an elastic material, such as rubber or resin, sucks and holds the semiconductor package 100, and is substantially tube shaped; a holding portion 71, which holds an outer periphery of the suction pad 70, and is approachably and separably attached to the probe holder 4 (a stepped portion of a holder hole 46 described later); and a coil spring 72, which abuts against the probe holder 4 and holding portion 71 and biases the holding portion 71 in a direction in which the holding portion 71 separates from the probe holder 4. A through hole 701, which is a tube shaped hollow space, is formed in the suction pad 70. Further, the holding portion 71 has a protruding portion 711, which protrudes from an outer periphery thereof and is annular shaped.

In the first member 41 and second member 42 of the probe holder 4, a holder hole 45 and the holder hole 46 for accommodating therein the holding portion 71 and coil spring 72 are formed, and the holder holes 45 and 46 accommodating therein the holding portion 71 and coil spring 72 are formed such that their axis lines are aligned with each other.

The holder holes 45 and 46 both have stepped hole shapes, each with different diameters along a penetrating direction thereof. That is, the holder hole 45 is formed of: a small diameter portion 45a having an opening at an upper end surface of the probe holder 4; and a large diameter portion 45b having a diameter larger than that of this small diameter portion 45a. The diameter of the small diameter portion 45a is smaller than a diameter of an inner circumference of the coil spring 72. Further, the large diameter portion 45b has a diameter a little larger than a diameter of an outer circumference of the coil spring 72 or a diameter formed by an edge end portion of the protruding portion 711.

The holder hole 46 is formed of: a small diameter portion 46a having an opening at a lower end surface of the probe holder 4; and a large diameter portion 46b having a diameter larger than that of this small diameter portion 46a. The diameter of the small diameter portion 46a is a little larger than a diameter of the outer circumference of the holding portion 71 excluding the protruding portion 711. Further, the large diameter portion 46b has a diameter a little larger than the diameter of the outer circumference of the coil spring 72 or a diameter formed by the edge end portion of the protruding portion 711.

The coil spring 72 has a function of preventing escape from the probe holder 4 by abutting against a boundary wall surface between the small diameter portion 45a and large diameter portion 45b of the holder hole 45. Further, the protruding portion 711 of the holding portion 71 has a function of preventing escape from the probe holder 4 by abutting against a boundary wall surface between the small diameter portion 46a and large diameter portion 46b of the holder hole 46. The coil spring 72 is provided between the small diameter portion 45a and protruding portion 711, and biases the holding portion 71 towards the second member 42 side from the first member 41 side.

When the probe holder 4 is attached to the base portion 6, the through hole 701 communicates with the flow channel formed of the first hole 63 (or second hole 64), first groove portion 65, and hole portion 66, via a gap formed between the semiconductor package 200 and a principal surface of the probe holder 4 (first member 41). Thereby, gas is able to be circulated inside the probe holder 4 and base portion 6.

Figure 10:
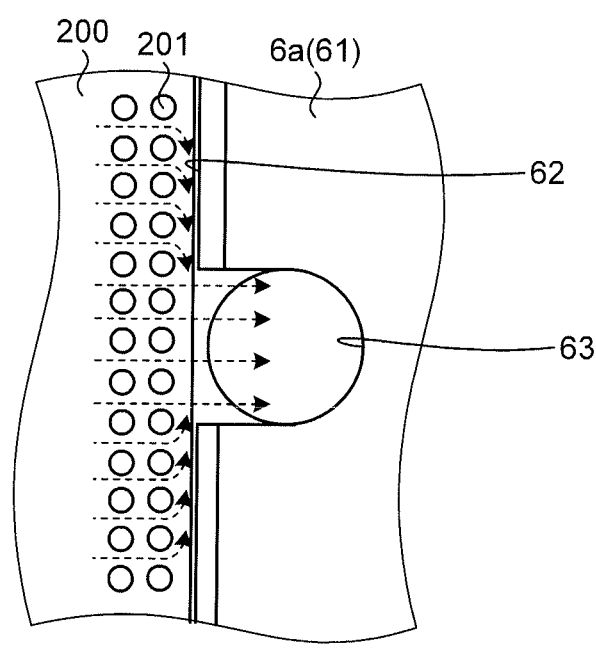
FIG. 10 is a diagram illustrating circulation of gas in the test unit according to the embodiment of the present invention.

FIG. 10 is a diagram illustrating circulation of gas in the test unit 1 according to this embodiment. When the suction pump (not illustrated) is connected to the hole portion 66 of the base portion 6 and suction is performed in the hole portion 66, suction force is generated in an opening of the through hole 701 in the suction pad 70. Gas sucked from the through hole 701 flows into the gap between the probe holder 4 and semiconductor package 200 via the large diameter portion 45b and small diameter portion 45a.

The gas that has flown into the gap between the probe holder 4 and semiconductor package 200 passes between the plural connection electrodes 201 and flows into the first hole 63 (or second hole 64). Thereafter, from the first hole 63 (or second hole 64), the gas passes the flow channel formed of the first groove portion 65 and hole portion 66 and is discharged to outside of the hole portion 66.

By ensuring the above described gas flow channel, testing is able to be performed by arranging the semiconductor packages 100 and 200 in their layering direction. Thereby, increase in size of the test unit due to the shifted arrangement from the layering direction is able to be avoided. Further, since the conduction path of the signal is via the probes 2 and 3 only and the path is not extended due to the wiring and the like, increase in the tact time and reduction in the test accuracy are able to be prevented.

According to the above described embodiment, since, in two semiconductor packages arranged in a layering direction thereof, a suction holder, which sucks and holds one of the semiconductor packages, is provided between these two semiconductor packages, and gas related to suction is circulated via a gap formed between the other semiconductor package and suction holder; when the two semiconductor packages are tested, a continuity test is able to be performed while preventing reduction in test accuracy and increase in tact time. Further, efficient testing is able to be implemented, by sucking and conveying semiconductor packages with a suction pad and sequentially changing and testing the semiconductor packages.

In the above described embodiment, the connection electrodes have been described as being hemispherical, but the connection electrodes may be flat plate shaped leads used in Quad Flat Packages (QFPs) and the like.

Further, an end portion at each distal end portion side of each flange portion, and each boundary wall surface between the large diameter portion and small diameter portion of the holder hole may be tapered. Thereby, positioning in a direction perpendicular to an axis line direction of the probe when the probe has been attached to the holder is able to be performed even more infallibly.

The probe 2 or 3 is not limited to the one formed of plungers and a coil spring, and may be a Pogo pin, or a wire probe that obtains load by warping a wire in a bow shape. Further, the closely fitted wound portion and roughly wound portion of the coil spring may be reversely embodied. In this case, the lengths of the proximal end portions of the first and second plungers are preferably reversed. Further, correspondingly to the above described probes, the probe holders may also be modified as appropriate.

INDUSTRIAL APPLICABILITY

As described above, the test unit according to the present invention is useful in performing a continuity test while preventing reduction in test accuracy and increase in tact time when two semiconductor packages are tested.

REFERENCE SIGNS LIST

1 TEST UNIT
2, 3 CONTACT PROBE (PROBE)
4, 5 PROBE HOLDER
6 BASE PORTION
7 SUCTION HOLDER
21, 31 FIRST PLUNGER
22, 32 SECOND PLUNGER
23, 33 COIL SPRING
41, 6a FIRST MEMBER
42, 6b SECOND MEMBER
43, 44, 45, 46 HOLDER HOLE
100, 200 SEMICONDUCTOR PACKAGE
101, 102, 201 CONNECTION ELECTRODE
300 CIRCUIT BOARD
301 ELECTRODE

The invention claimed is:

1. A test unit that performs testing of two contact targets, at least of one of which includes electrodes on both sides thereof, the two contact targets being substantially plate shaped and arranged in a layering direction thereof, the test unit comprising:
    a first contact probe that comes into contact, at one longitudinal direction end portion side thereof, with an electrode provided on a front surface of one of the contact targets, and comes into contact, at the other end portion side thereof, with an electrode of the other contact target;
    a second contact probe that comes into contact, at one longitudinal direction end portion side thereof, with an electrode provided on a back surface of the one of the contact targets, and comes into contact, at the other end portion side thereof, with an electrode of a substrate that outputs a signal for the testing;
    a first probe holder including a suction holder that directly sucks and holds the one of the contact targets to the first probe holder and accommodating and holding therein a plurality of the first contact probes according to a predetermined pattern;
    a second probe holder accommodating and holding therein a plurality of the second contact probes according to a predetermined pattern; and
    a base portion that is layered over the first probe holder and holds, at a side thereof layered over the first probe holder, the other contact target, wherein
    a gap is formed between the other contact target and the first probe holder.

2. The test unit according to claim 1, wherein the base portion includes a flow channel formed therein, through which the gap communicates with outside.

3. The test unit according to claim 1, wherein the suction holder comprises:
    a suction pad that is formed by use of an elastic material, sucks and holds the one of the contact targets, has a substantially tube shape, and includes a through hole formed therein, the through hole communicating with the gap;
    a holding portion that holds an outer periphery of the suction pad and is approachably and separably attached to the first probe holder; and
    a coil spring that biases the holding portion in a direction in which the holding portion separates from the first probe holder.

4. The test unit according to claim 1, wherein the first contact probe comprises:
    a first contact member that is provided at the one longitudinal direction end portion side, has a plurality of claw portions having tapered distal end shapes, and comes into contact with the electrode of the contact target;
    a second contact member that is provided at the other longitudinal direction end portion side, has a plurality of claw portions having tapered distal end shapes, and comes into contact with the electrode of the substrate; and
    a coil spring that is provided between the first contact member and the second contact member, and expandably and contractably joins the first and second contact members together.

* * * * *